US012765313B2

(12) United States Patent
Holt et al.

(10) Patent No.: US 12,765,313 B2
(45) Date of Patent: Oct. 13, 2026

(54) METHODS AND APPARATUS FOR CHUCKING A BOWED SUBSTRATE

(71) Applicant: Applied Materials, Inc., Santa Clara, CA (US)

(72) Inventors: Joshua Stuart Holt, Sunnyvale, CA (US); Mariia Gorchichko, San Jose, CA (US); Shubhendra Kumar Jain, Belmont, MA (US); Archana Kumar, Mountain View, CA (US); Benjamin D. Briggs, Merrimack, NH (US); Ivan Bizyukov, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 141 days.

(21) Appl. No.: 18/655,185

(22) Filed: May 3, 2024

(65) Prior Publication Data

US 2025/0343061 A1 Nov. 6, 2025

(51) Int. Cl.

| | |
|---|---|
| ***H10P 72/00*** | (2026.01) |
| ***H10P 72/70*** | (2026.01) |
| ***H10P 72/72*** | (2026.01) |
| ***H10P 72/78*** | (2026.01) |

(52) U.S. Cl.

CPC .......... *H10P 72/0616* (2026.01); *H10P 72/70* (2026.01); *H10P 72/722* (2026.01); *H10P 72/78* (2026.01); *H10P 72/0428* (2026.01)

(58) Field of Classification Search

CPC .... H10P 72/0616; H10P 72/70; H10P 72/722; H10P 72/78; H10P 72/0428; H10P 72/0434

USPC .......................................................... 361/234

See application file for complete search history.

(56) References Cited

U.S. PATENT DOCUMENTS

| | | | |
|---|---|---|---|
| 8,241,961 B2 | 8/2012 | Kim et al. | |
| 8,404,572 B2 | 3/2013 | Chang et al. | |
| 9,911,636 B1 | 3/2018 | Weed | |
| 10,431,468 B2 | 10/2019 | DeVilliers et al. | |
| 2002/0137330 A1* | 9/2002 | Ryan ................ | H01L 21/76849 438/633 |
| 2008/0124820 A1 | 5/2008 | Levinson et al. | |

(Continued)

FOREIGN PATENT DOCUMENTS

| | | |
|---|---|---|
| CN | 114709145 A | 7/2022 |
| JP | H09-167384 A | 6/1997 |
| KR | 10-2022-0078126 A | 6/2022 |

OTHER PUBLICATIONS

PCT International Search Report and Written Opinion for PCT/US2025/027404 dated Aug. 11, 2025.

*Primary Examiner* — Sreeya Sreevatsa

(74) *Attorney, Agent, or Firm* — Moser Taboada

(57) ABSTRACT

Methods and substrate processing systems of chucking a bowed substrate are provided herein. In some embodiments, a substrate processing system includes: a pedestal to support a substrate, the pedestal having a plurality of chucking regions; a warpage detection system having one or more sensors to detect warpage of the substrate; and a plurality of adjustable chucking components disposed in the pedestal corresponding with the plurality of chucking regions, wherein the plurality of adjustable chucking components are configured to facilitate applying different amounts of force, heating, or cooling to the substrate based on the warpage of the substrate.

20 Claims, 6 Drawing Sheets

(56) References Cited

U.S. PATENT DOCUMENTS

| | | | | |
|---|---|---|---|---|
| 2013/0052756 | A1* | 2/2013 | Okujo | H10P 72/0602 219/491 |
| 2013/0100573 | A1* | 4/2013 | Shu | H10P 72/0616 361/234 |
| 2015/0155196 | A1* | 6/2015 | Wu | H10P 72/78 451/41 |
| 2016/0322234 | A1* | 11/2016 | Lew | H10P 95/906 |
| 2018/0122680 | A1* | 5/2018 | Yang | H10P 72/722 |
| 2018/0218928 | A1* | 8/2018 | Peh | H05B 3/0047 |
| 2021/0057238 | A1 | 2/2021 | Tan et al. | |
| 2022/0301915 | A1* | 9/2022 | Konnoth Joseph | H10P 72/722 |

* cited by examiner

METHODS AND APPARATUS FOR CHUCKING A BOWED SUBSTRATE

FIELD

Embodiments of the present disclosure generally relate to methods and apparatus for processing a substrate.

BACKGROUND

In wafer-to-wafer hybrid bonding, flatness of the wafers is desirable for yielding a good bond between the wafers and reducing misalignment between the wafers. Local stresses associated with 3D structures on substrates may lead to large or irregular bowing of the substrate. However, conventional methods of chucking a bowed substrate are often inadequate at chucking substrates with certain shapes of bowing (e.g., asymmetric, saddle shaped, or the like). Moreover, conventional methods of chucking a bowed substrate may exert too much force at certain regions of the substrate, leading to breaking or cracking of the substrate. Accordingly, the inventors have provided herein improved methods and apparatus of chucking a bowed substrate.

SUMMARY

Methods and substrate processing systems of chucking a bowed substrate are provided herein. In some embodiments, a substrate processing system includes: a pedestal to support a substrate, the pedestal having a plurality of chucking regions; a warpage detection system having one or more sensors to detect warpage of the substrate; and a plurality of adjustable chucking components disposed in the pedestal corresponding with the plurality of chucking regions, wherein the plurality of adjustable chucking components are configured to facilitate applying different amounts of force, heating, or cooling to the substrate based on the warpage of the substrate.

In some embodiments, a method of chucking a bowed substrate includes placing the bowed substrate on a substrate support having a plurality of chucking regions; detecting, with a warpage detection system having one or more sensors, one or more contact regions of the plurality of chucking regions where the bowed substrate is touching the substrate support and one or more non-contact regions of the plurality of chucking regions where the bowed substrate is not touching the substrate support; and applying a different amount of force, heating, or cooling to the bowed substrate via the substrate support at locations corresponding to the one or more non-contact regions than force, heating, or cooling applied to the one or more contact regions to flatten the bowed substrate.

In some embodiments, a method of chucking a bowed substrate includes: placing the bowed substrate on a substrate support having a plurality of chucking regions; detecting, with a warpage detection system having one or more sensors, one or more contact regions of the plurality of chucking regions where the bowed substrate is touching the substrate support and one or more non-contact regions of the plurality of chucking regions where the bowed substrate is not touching the substrate support; and applying a different amount of force, heating, or cooling to the bowed substrate via the substrate support at locations corresponding to the one or more non-contact regions than force, heating, or cooling applied to the one or more contact regions to flatten the bowed substrate, and wherein applying the force, heating, or cooling comprises at least one of: vacuum chucking the bowed substrate; electrostatically chucking the bowed substrate via a plurality of electrodes disposed in the substrate support; heating or cooling the bowed substrate via a heater or cooling channels disposed in the substrate support; magnetically attracting the bowed substrate via magnets disposed in the substrate support; or applying a physical force on the bowed substrate via a plurality of pushers.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
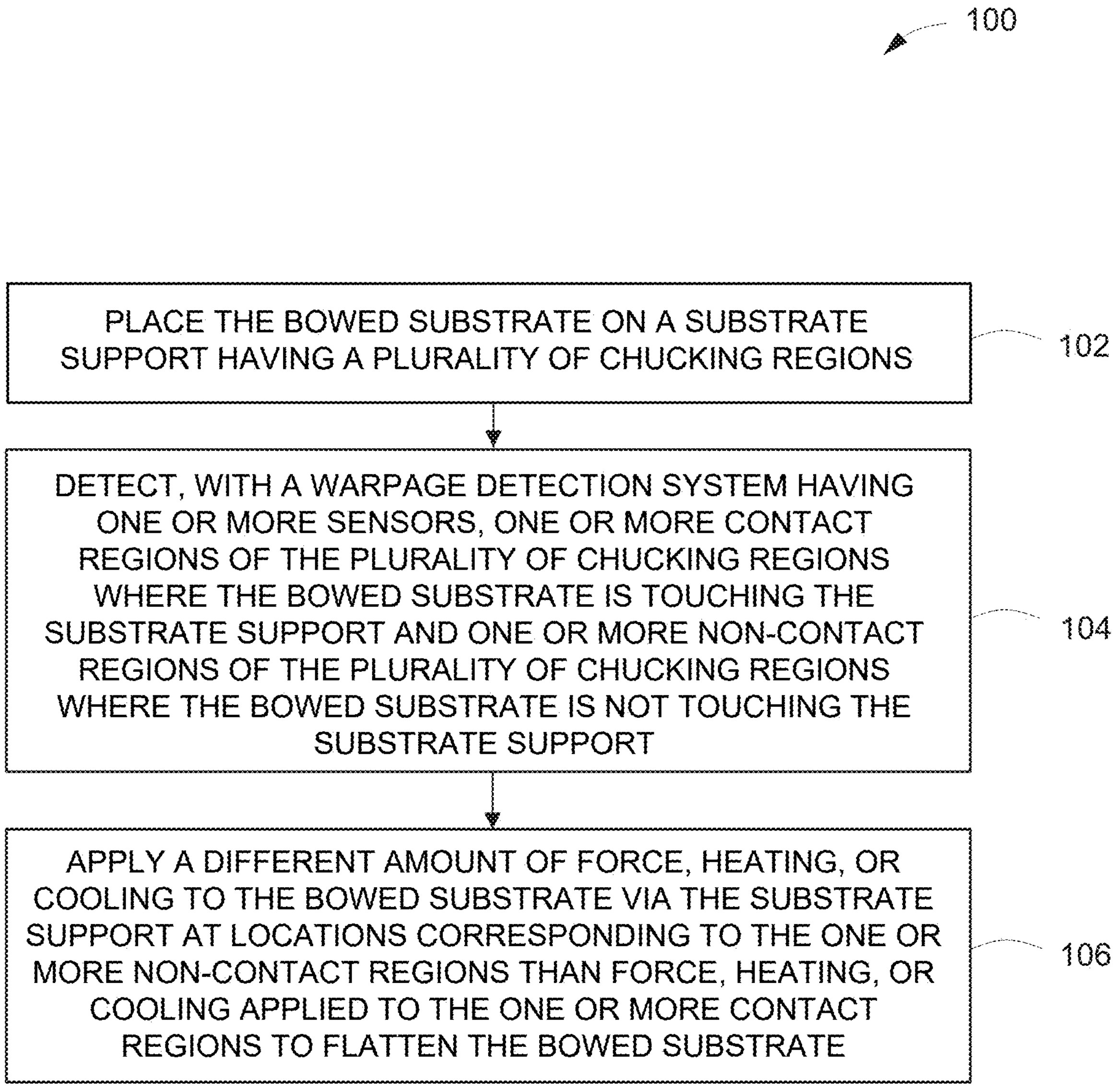
FIG. 1 depicts a flow chart of a method 100 of chucking a bowed substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for chucking and/or flattening substrates are provided herein. Increased flatness of the substrates may advantageously allow for bonding of substrates (e.g., wafer-to-wafer bonding) with improved alignment and improved yield. Increased flatness may also allow for bonding of substrates having smaller copper interconnects and a higher density of interconnects. The inventors have observed that uniform force applied to a bowed substrate to flatten the bowed substrate can lead to unintended cracking or breakage of the bowed substrate. For example, silicon in a bowed substrate breaks or cracks at around 150-200 MPa, so any stress above that amount would damage the bowed substrate. The methods and apparatus provided herein include localized compensation or force from adjustable chucking components of the substrate support. The localized compensation advantageously allows for correcting for bowing in different parts of the substrate with different amounts of compensation or force. The different parts of the substrate may be arranged in a plurality of chucking zones having an arbitrary shape and size as needed to compensate for expected bowing of the substrate.

FIG. 1 depicts a flow chart of a method 100 of chucking a bowed substrate (e.g., bowed substrate 212) in accordance with at least some embodiments of the present disclosure. At 102, the method 100 includes placing the bowed substrate on a substrate support (e.g., substrate support 210) having a plurality of chucking regions (e.g., plurality of chucking regions 404). The plurality of chucking zones may have an arbitrary shape and size. For example, in some embodiments, the plurality of chucking regions are pie shaped. In some embodiments, the plurality of chucking regions include a central region and a plurality of pie shaped regions disposed about the central region. In some embodiments, the plurality of chucking zones are not arranged in a concentric pattern.

Figure 2:
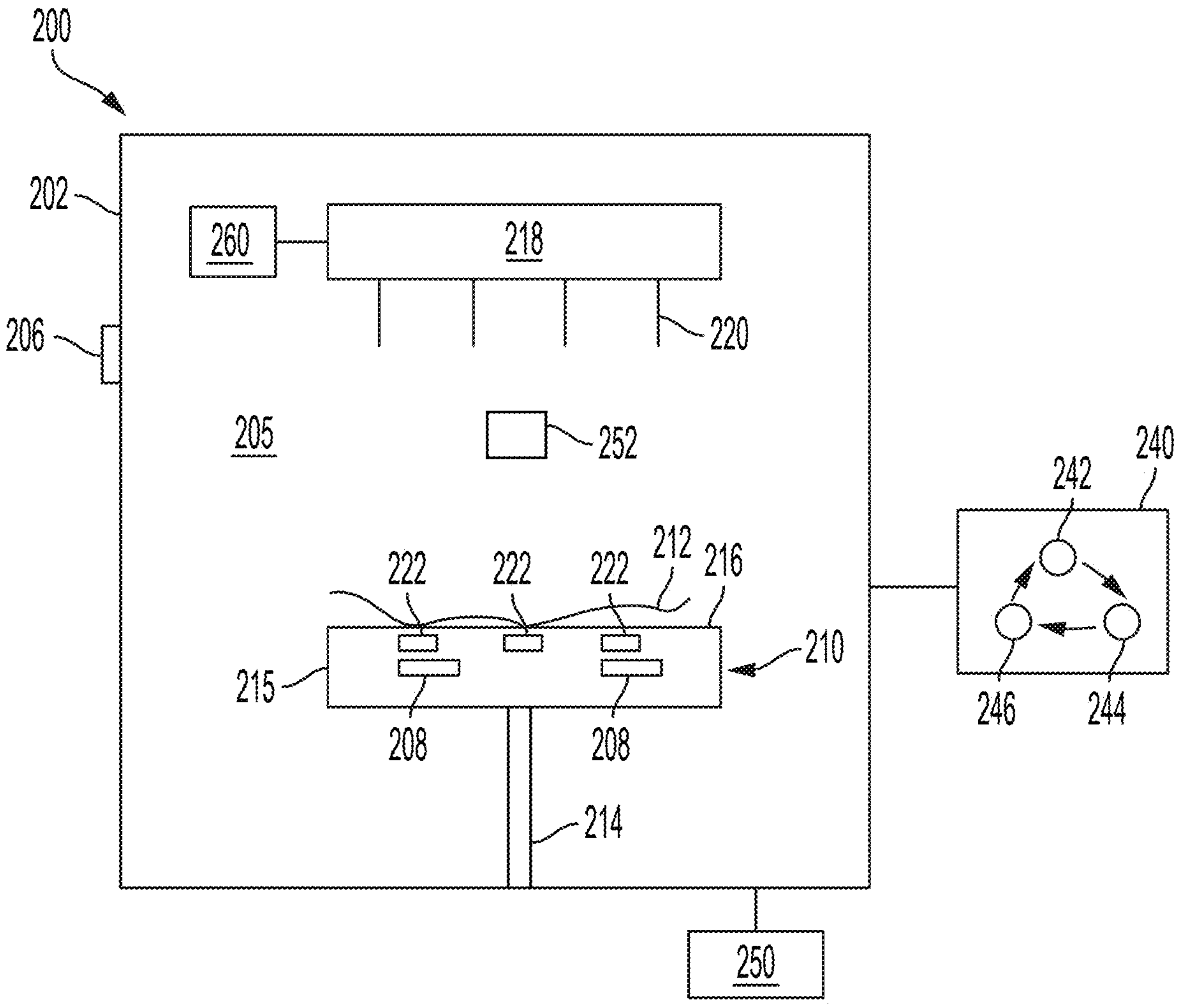
FIG. 2 depicts a schematic side view of a bonding chamber in accordance with at least some embodiments of the present disclosure.

The substrate support may be disposed in a process chamber (e.g., bonding chamber 200), or substrate processing system. The substrate support may also be used with other types of process chambers or substrate processing systems such as deposition chambers, etching chambers, or the like. FIG. 2 depicts a schematic side view of a bonding chamber 200 in accordance with at least some embodiments of the present disclosure. The bonding chamber 200 may be a suitable chamber for performing a hybrid bonding process. The bonding chamber 200 generally includes a chamber body 202 that defines an interior volume 205 therein. A substrate support 210 is disposed in the interior volume 205 and includes a receiving surface 216 configured to support a bowed substrate 212. In some embodiments, the bowed substrate 212 has a saddle shape, or other irregular shape. In some embodiments, the bowed substrate 212 has a bowl shape. The substrate 212 may be transferred into and out of the interior volume 205 via a transfer slot 206 disposed in the chamber body 202.

At 104, the method 100 includes detecting, with a warpage detection system disposed in the substate support or above the substrate support, one or more contact regions where the bowed substrate is touching the substrate support and one or more non-contact regions where the bowed substrate is not touching the substrate support. The warpage detection system generally comprises a system suitable for bow measurement of a substrate. For example, the warpage detection system may have one or more sensors to detect warpage of the substrate, such as a plurality of displacement sensors, an optical measurement system having one or more optical sensors, or the like. The plurality of displacement sensors may comprise any suitable contact type sensors, or non-contact type sensors such as optical sensors, eddy current type sensors, ultrasonic sensors, or laser sensors. In some embodiments, the plurality of displacement sensors may include a plurality of capacitive sensors.

Referring back to FIG. 2, in some embodiments, the warpage detection system comprises an optical detection system 252 disposed above the substrate support 210. The optical detection system 252 may be configured to determine warpage measurements between the substrate support 210 and the substrate support 210 via the use of one or more light beams directed at the bowed substrate 212. For example, the one or more light beams directed at the bowed substrate 212 may be reflected and analyzed in a suitable manner to determine the warpage measurements.

In some embodiments, the warpage detection system comprises a plurality of displacement sensors 222. In some embodiments, each of the plurality of chucking regions includes a displacement sensor (e.g., plurality of displacement sensors 222). In some embodiments, each of the plurality of chucking regions include a plurality of displacement sensors. In some embodiments, at least one of the plurality of chucking regions include a single displacement sensor and at least one of the plurality of chucking regions include a plurality of displacement sensors. A single displacement sensor can be used for chucking regions where fine control of the bow is not desired. Multiple displacement sensors can be used in certain chucking regions to provide more fine control and understanding of the bow profile of the bowed substrate. In some embodiments, the plurality of displacement sensors are a plurality of capacitive sensors.

In some embodiments, the bowed substrate 212 comprises a silicon substrate having copper interconnects. The substrate support 210 includes a plurality of displacement sensors 222 disposed therein. The substrate support 210 also includes a plurality of adjustable chucking components 208 (described in more detail below). The substrate support 210 may include a support shaft 214 for supporting a pedestal 215 of the substrate support 210. In some embodiments, the pedestal 215 comprises a dielectric plate. In some embodiments, the bonding chamber 200 may include a vacuum system 250 coupled to the chamber body 202 for reducing a pressure in the bonding chamber 200.

A controller 240 generally controls the operation of the bonding chamber 200. For example, the controller 240 may control the substrate support 210, including the displacement sensors disposed therein or optical detection system 252, and methods of applying force, heating, or cooling to a bowed substrate as described herein. The controller 240 generally includes a central processing unit (CPU) 242, a memory 244, and a support circuit 246. The CPU 242 may be one of any form of a general-purpose computer processor that can be used in an industrial setting. The support circuit 246 is conventionally coupled to the CPU 242 and may comprise a cache, clock circuits, input/output subsystems, power supplies, and the like. Software routines, such as processing methods as described above may be stored in the memory 244 and, when executed by the CPU 242, transform the CPU 242 into a specific purpose computer (controller 240). In operation, the controller 240 may provide instructions to system components to perform the methods described herein. For example, the memory 244 can be a non-transitory computer readable storage medium having instructions that when executed by the CPU 242 (or controller 240) perform the methods described herein.

Figure 3:
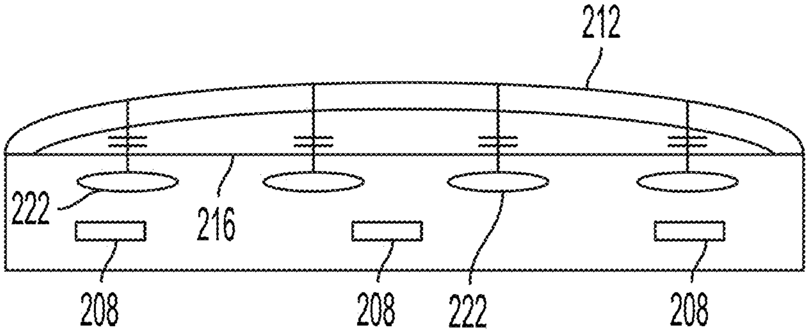
FIG. 3 depicts a schematic side view of a substrate support in accordance with at least some embodiments of the present disclosure.

FIG. 3 depicts a schematic side view of a substrate support in accordance with at least some embodiments of the present disclosure. The plurality of displacement sensors 222 are disposed below the receiving surface 216 and configured to detect a capacitance between each of the plurality of displacement sensors 222 and the bowed substrate 212, for example, a top surface of the bowed substrate 212 at the location vertically above each displacement sensor. Based on the detected, or measured, capacitance value, a determination can be made whether or not the bowed substrate 212 is touching the receiving surface 216. Accordingly, the plurality of chucking regions can be classified into contact regions and non-contact regions. In some embodiments, based on the detected capacitance value, a determination can be made as to the degree of the bowing or warpage at locations associated with each of the plurality of displacement sensors 222 at the non-contact regions.

At 106, the method 100 includes applying a force, heating, or cooling to the bowed substrate via the substrate support (e.g., via the plurality of adjustable chucking components 208) at locations corresponding to the one or more non-contact regions that is greater than a force, heating, or cooling applied to the one or more contact regions to flatten the bowed substrate. The plurality of adjustable chucking components are configured to facilitate applying different amounts of force, heating, or cooling to the substrate based on the warpage of the substrate. For example, the plurality of adjustable chucking components 208 may be configured to correct for bowing of about 10 microns to about 800 microns. In some embodiments, applying the force comprises vacuum chucking the bowed substrate. In some embodiments, the substrate support does not apply force, heating, or cooling to the bowed substrate at the contact regions. In some embodiments, the method 100 includes reducing a pressure in the bonding chamber to a vacuum pressure prior to applying the force to the non-contact regions. For example, wherein applying the force on the bowed substrate comprises electrostatically chucking the bowed substrate or providing non-uniform heating or cooling to the bowed substrate as described herein, the pressure in the bonding chamber may be reduced to vacuum pressure. In some embodiments, vacuum chucking may be suitable for correcting bowing of up to about 300 microns.

Figure 4:
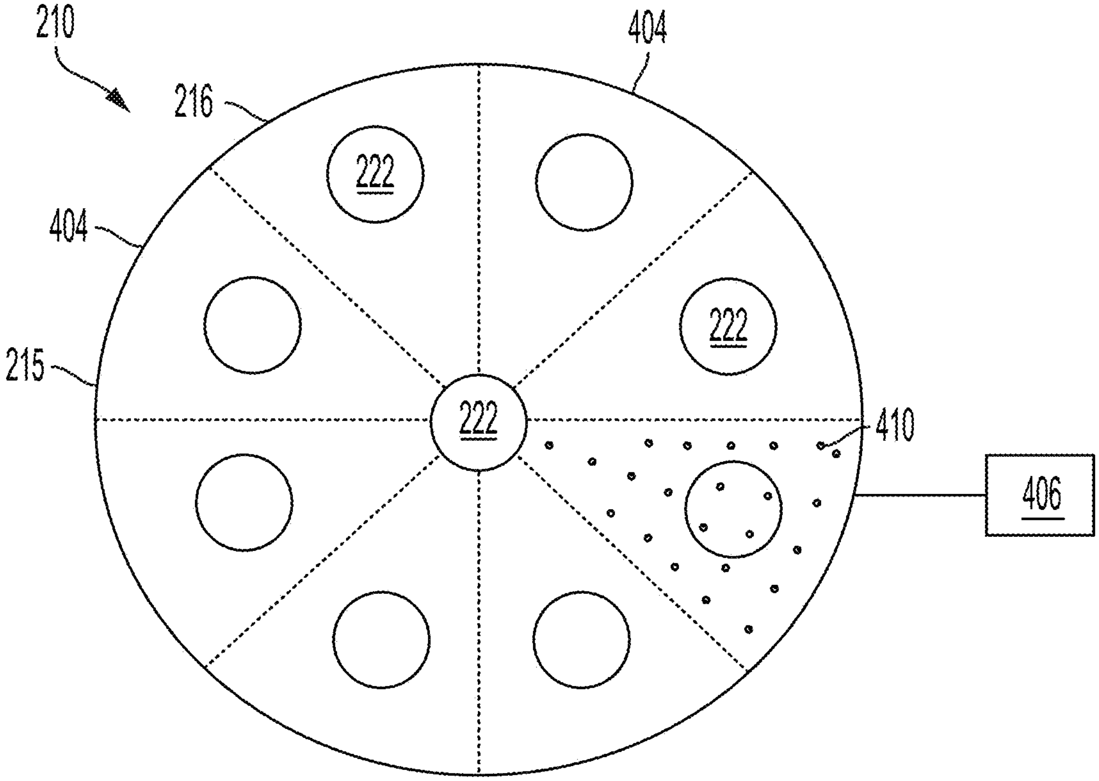
FIG. 4 depicts a schematic top view of a substrate support in accordance with at least some embodiments of the present disclosure.

FIG. 4 depicts a schematic top view of a substrate support 210 configured for vacuum chucking the bowed substrate 212 in accordance with at least some embodiments of the present disclosure. As depicted in FIG. 4, the substrate support 210 has a plurality of chucking regions 404 that are pie or wedge shaped. The plurality of adjustable chucking components 208, for vacuum chucking, comprises a plurality of vacuum holes 410 extending to the receiving surface 216 to apply force on a bottom surface of the substrate 212 corresponding with the plurality of chucking regions 404. A pump 406 is coupled to the plurality of vacuum holes 410 to provide a suction force at the receiving surface 216. The plurality of vacuum holes 410 associated with each of the plurality of chucking regions 404 may be fluidly independent of each other such that a different amount of vacuum strength can be applied to each chucking region. For example, more vacuum force can be applied to chucking regions where the bowed substrate 212 is farther from the receiving surface 216.

Figure 5:
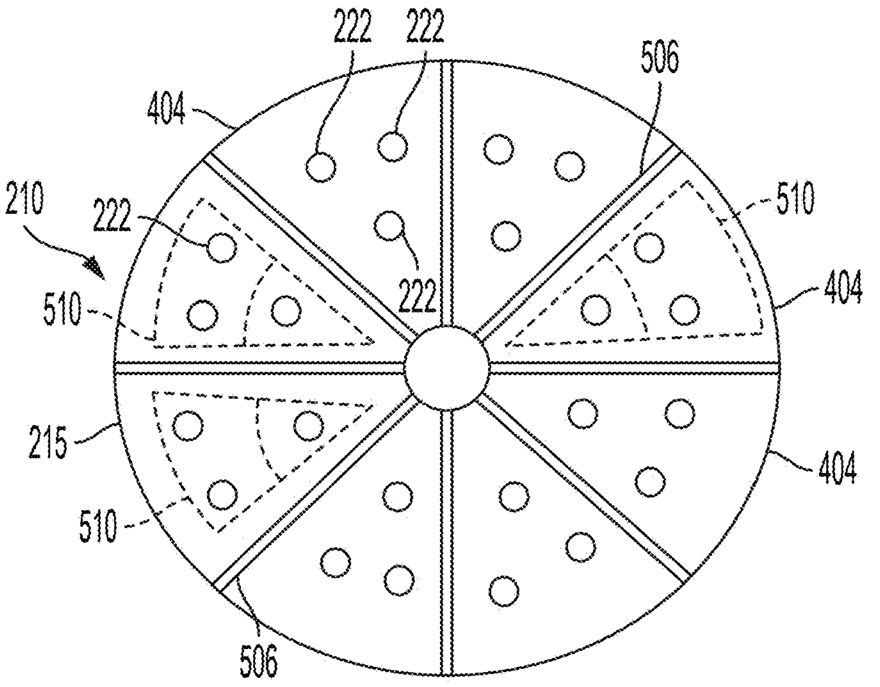
FIG. 5 depicts a schematic top view of a substrate support in accordance with at least some embodiments of the present disclosure.

In some embodiments, applying the force comprises electrostatically chucking the bowed substrate via a plurality of electrodes (e.g., plurality of electrodes 510) disposed in the substrate support. FIG. 5 depicts a schematic top view of a substrate support 210 in accordance with at least some embodiments of the present disclosure. In some embodiments, the plurality of adjustable chucking components 208, for electrostatically chucking the bowed substrate, comprises a plurality of electrodes 510, or chucking electrodes disposed in the pedestal 215. The plurality of electrodes 510 may be electrically separated corresponding to the plurality of chucking regions 404 so that different amounts of electrostatic force can be provided to each chucking region. In some embodiments, the substrate support 210 includes electrical isolators 506 disposed between adjacent ones of the plurality of chucking regions 404 to reduce or prevent electrical interference between adjacent chucking regions. In some embodiments, as shown in FIG. 5, each of the plurality of chucking regions 404 can include a plurality of the plurality of displacement sensors 222.

In some embodiments, the plurality of adjustable chucking components are configured to apply different amounts of heating or cooling to the plurality of chucking regions of the substrate based on the warpage of the substrate to flatten the substrate. For example, the plurality of adjustable chucking components may comprise a heater (e.g., heater 630) or cooling channels (e.g., cooling channels 620) disposed in the substrate support to provide non-uniform heating or cooling to the bowed substrate.

For example, the method 100 may include cooling chucking regions where excessive tensile stress is causing bowing in the bowed substrate 212, thereby providing compensating compressive stress that reduces the tensile stress and bowing in such regions. Similarly, the method 100 may include heating chucking regions having compressive stress to provide compensating tensile stress that reduces bowing in such regions. In some embodiments, applying the cooling comprises cooling the bowed substrate with a coolant such as liquid nitrogen flowing through the cooling channels. In some embodiments, the heater comprises a plurality of independent resistive heating elements separated by chucking region. In some embodiments, applying heating or cooling comprises heating some of the chucking regions and cooling other ones of the chucking regions. As such, applying a non-uniform temperature profile on the bowed substrate based on contact and non-contact regions determined by the displacement sensors can advantageously flatten the bowed substrate 212.

Figure 6:
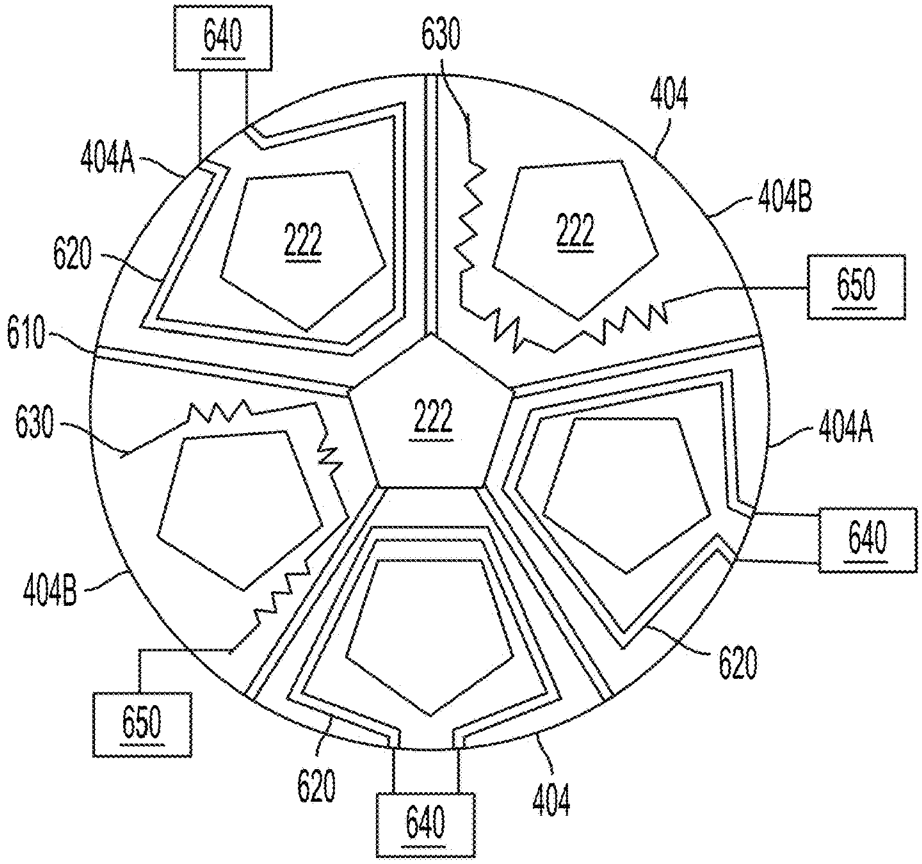
FIG. 6 depicts a schematic top view of a substrate support in accordance with at least some embodiments of the present disclosure.

FIG. 6 depicts a schematic top view of a substrate support configured for heating or cooling the bowed substrate in accordance with at least some embodiments of the present disclosure. For example, the plurality of chucking regions 404 may include one or more chucking regions classified as cooling regions 404A having cooling channels 620 disposed therein for circulating a coolant. In some embodiments, the cooling channels 620 in the substrate support 210 are separated by chucking region to provide independent cooling to each chucking region. Each of the separated cooling channels may be coupled to an associated one of the chiller 640 configured to circulate the coolant. In some embodiments, the separated cooling channels 620 may be coupled to a common one of the chiller 640. In some embodiments, the chucking region may be cooled to about negative 196 degrees Celsius.

The plurality of chucking regions 404 may include one or more chucking regions classified as heating regions 404B having a heater 630 disposed therein. The heater 630 generally comprises a resistive heating element that emits heat when coupled to a power source 650. The heater 630 may comprise a plurality of resistive heating elements separated by chucking region to provide independent heating to each respective chucking region. In some embodiments, the chucking region may be heated to up to 1200 Celsius. The plurality of resistive heating elements may be coupled to a common one of the power source 650 or may be coupled to separates ones of the power source 650. In some embodiments, each of the plurality of chucking regions 404 include both the heater 630 and the cooling channels 620 to selectively provide heating or cooling to each chucking region. In some embodiments, the substrate support 210 includes thermal insulators 610 disposed between adjacent ones of the plurality of chucking regions 404 to reduce or prevent thermal coupling between chucking regions. In some embodiments, the thermal insulators 610 are made of an insulative material such as silicon dioxide ($SiO_2$).

In some embodiments, applying the force comprises applying a physical force on the bowed substrate via a plurality of pushers (e.g., plurality of pushers 220, 804). For example, referring back to FIG. 2, the substrate support 210 may include a pusher apparatus 218 disposed above the pedestal 215 having a plurality of pushers 220. As depicted in FIG. 2, the physical force may be applied to an upper surface of the bowed substrate 212 via the plurality of pushers 220. Each pusher of the plurality of pushers can be coupled to an actuator 260 configured to move each pusher up or down. In some embodiments, the plurality of pushers 220 are spring loaded and the pusher apparatus 218 may be lowered onto the bowed substrate 212. The spring-loaded feature of the plurality of pushers 220 can provide non-uniform force to the bowed substrate 212 (e.g., more force where bowed substrate 212 is more elevated from the receiving surface 216).

Figure 7:
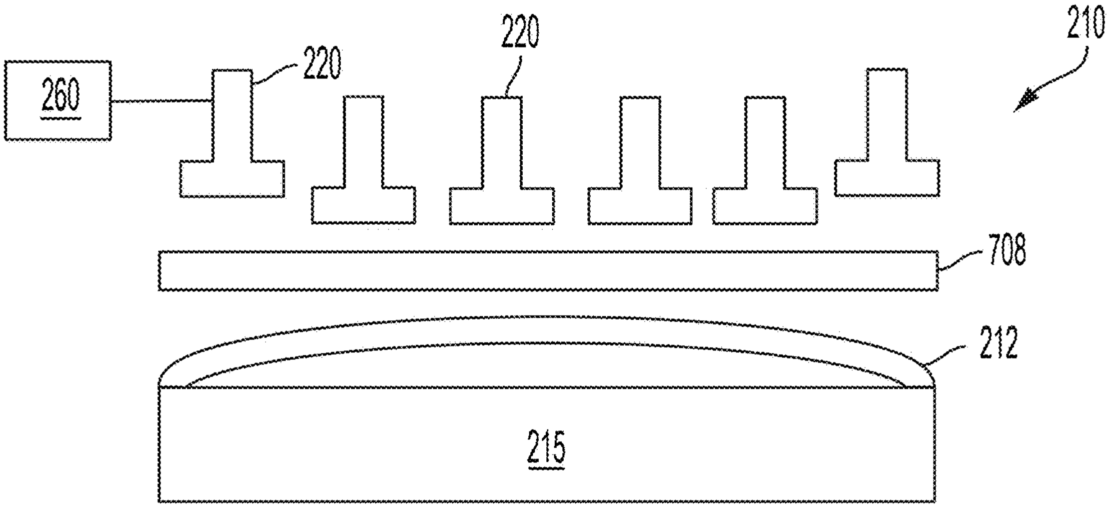
FIG. 7 depicts a schematic side view of a substrate support in accordance with at least some embodiments of the present disclosure.

FIG. 7 depicts a schematic side view of a substrate support 210 configured for applying a physical force on a bowed substrate 212 in accordance with at least some embodiments of the present disclosure. In some embodiments, during hybrid bonding, a second substrate 708 may be disposed on the bowed substrate 212. The plurality of pushers 220 may be configured to force the second substrate 708 towards the bowed substrate 212 to compression bond the second substrate 708 to the bowed substrate 212. Pushers of the plurality of pushers 220 associated with the non-contract regions can be configured to apply greater force on the bowed substrate 212 than pushers associated with the contact regions of the bowed substrate 212.

Figure 8:
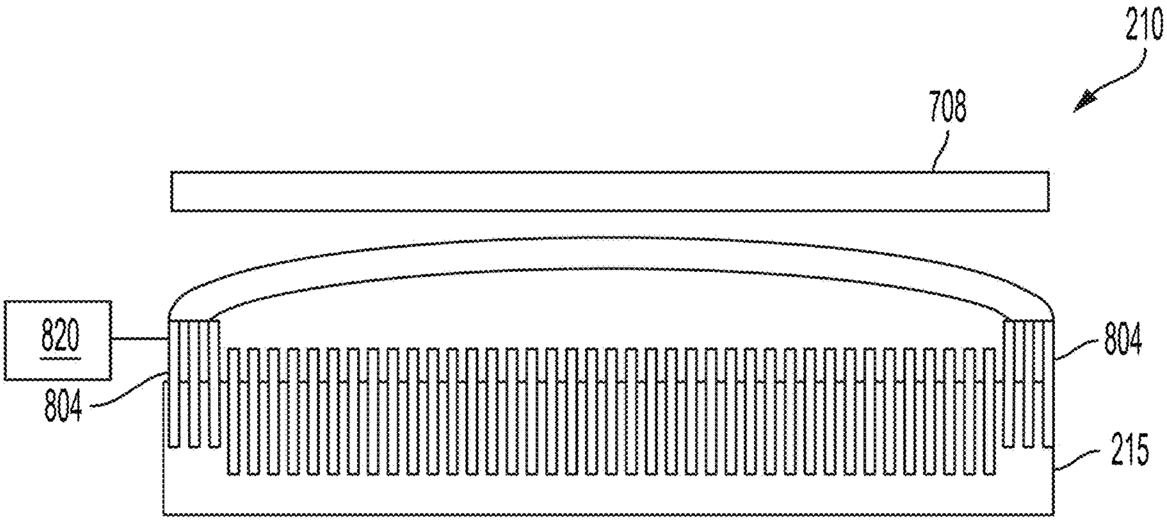
FIG. 8 depicts a schematic side view of a substrate support in accordance with at least some embodiments of the present disclosure.

FIG. 8 depicts a schematic side view of a substrate support 210 configured for applying a physical force on a lower surface of the bowed substrate 212 in accordance with at least some embodiments of the present disclosure. In some embodiments, a plurality of pushers 804 are at least partially disposed in the pedestal 215. The plurality of pushers 804 may be spring loaded, or electrically controlled via actuators 820, motors, or the like. Pushers of the plurality of pushers 804 associated with the non-contract regions can be configured to apply greater force on the bowed substrate 212 than pushers associated with the contact regions of the bowed substrate 212. In some embodiments, the substrate support 210 may include the plurality of pushers 220 disposed above the pedestal and the plurality of pushers 804 disposed in the pedestal 215. In some embodiments, the plurality of pushers 804 are smaller in width than the plurality of pushers 220.

Figure 9:
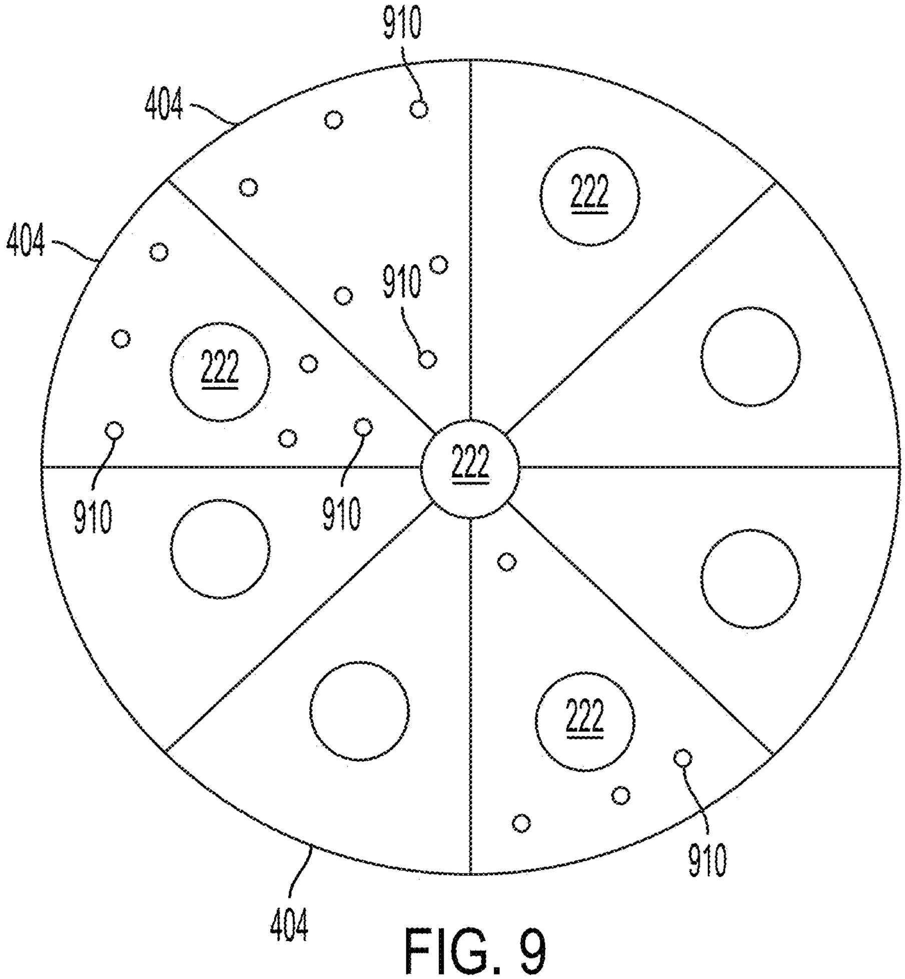
FIG. 9 depicts a schematic top view of a substrate support in accordance with at least some embodiments of the present disclosure.

In some embodiments, applying the force comprises magnetically attracting the bowed substrate via magnets disposed in the substrate support. For example, FIG. 9 depicts a schematic top view of a substrate support configured for applying a magnetic force on a bowed substrate in accordance with at least some embodiments of the present disclosure. As shown in FIG. 9, the plurality of chucking regions 404 may include associated ones of a plurality of magnets 910. The plurality of magnets may be disposed in the substrate support 210 under the receiving surface 216. In some embodiments, the plurality of magnets 910 may be electromagnets with magnetic strength controlled by chucking region. In some embodiments, the plurality of magnets 910 may be rare earth magnets arranged in the substrate support 210 according to a predictable shape of the bowed substrate 212. As such, the plurality of magnets 910 may be configured to provide localized force to the bowed substrate 212. In some embodiments, the rare earth magnets may provide up to about 1 MPa of pressure or force on the bowed substrate 212. Electromagnets can provide a higher amount of force depending on the power provided to the electromagnets.

In some embodiments, applying the force, heating, or cooling on the bowed substrate may comprise using any combination of two or more of the forces, heating, or cooling described herein. For example, applying the force on the bowed substrate may comprise heating or cooling the bowed substrate and electrostatically chucking the bowed substrate. In another example, applying the force on the bowed substrate may comprise heating or cooling the bowed substrate and applying magnetic force on the bowed substrate.

In some embodiments, the method 100 includes: subsequent to applying the force, heating, or cooling on the bowed substrate, detecting, with the displacement sensor, remaining non-contact regions of the plurality of chucking regions. In some embodiments, the method 100 includes applying additional force, heating, or cooling via the adjustable chucking components 208 discussed herein, on the bowed substrate at the remaining non-contact regions. As such, the method 100 may include repeatedly detecting non-contact regions and applying additional force at the non-contact regions until either no non-contact regions remain or a predetermined amount of non-contact regions remain.

While the foregoing is directed to embodiments of the present disclosure, other and further embodiments of the disclosure may be devised without departing from the basic scope thereof.

The invention claimed is:

1. A substrate processing system, comprising:

a pedestal to support a substrate, the pedestal having a plurality of chucking regions, wherein the plurality of chucking regions comprise a central chucking region and a plurality of peripheral chucking regions disposed about the central chucking region and having a different shape than the central chucking region;

a warpage detection system having one or more sensors to detect warpage of the substrate; and a plurality of adjustable chucking components disposed in the pedestal corresponding with the plurality of chucking regions, wherein the plurality of adjustable chucking components are configured to facilitate applying different amounts of force, heating, or cooling to the substrate based on the warpage of the substrate.

2. The substrate processing system of claim 1, wherein each of the plurality of adjustable chucking components comprises at least one of a chucking electrode, a vacuum chuck, a heater, a cooling channel, plurality of pushers, or a magnet.

3. The substrate processing system of claim 1, wherein each of the plurality of adjustable chucking components comprise at least one of:

a chucking electrode, and wherein the pedestal includes electrical isolators disposed between adjacent ones of the plurality of chucking regions, or a heater or cooling channel, and wherein the pedestal includes thermal insulators disposed between adjacent ones of the plurality of chucking regions.

4. The substrate processing system of claim 1, wherein the plurality of peripheral chucking regions are pie shaped.

5. The substrate processing system of claim 1, wherein the warpage detection system comprises a plurality of displacement sensors disposed in the pedestal, wherein each of the plurality of chucking regions includes at least one displacement sensor.

6. The substrate processing system of claim 1, wherein the plurality of adjustable chucking components comprise a plurality of pushers, and wherein each pusher of the plurality of pushers is coupled to an actuator configured to move each pusher up or down.

7. A method of chucking a bowed substrate, comprising:

placing the bowed substrate on a substrate support having a plurality of chucking regions;

detecting, with a warpage detection system having one or more sensors, one or more contact regions of the plurality of chucking regions where the bowed substrate is touching the substrate support and one or more non-contact regions of the plurality of chucking regions where the bowed substrate is not touching the substrate support; and applying a different amount of force, heating, or cooling to the bowed substrate via the substrate support at locations corresponding to the one or more non-contact regions than force, heating, or cooling applied to the one or more contact regions to flatten the bowed substrate.

8. The method of claim 7, wherein applying the force comprises vacuum chucking the bowed substrate.

9. The method of claim 7, wherein applying heating or cooling comprises providing non-uniform heating or non-uniform cooling to the bowed substrate via a heater or cooling channels disposed in the substrate support.

10. The method of claim 7, wherein applying the force comprises:

magnetically attracting the bowed substrate via magnets disposed in the substrate support.

11. The method of claim 7, wherein applying the force comprises applying a physical force on the bowed substrate via a plurality of pushers.

12. The method of claim 7, wherein the plurality of chucking regions are pie shaped.

13. The method of claim 7, further comprising:

subsequent to applying the force, heating, or cooling on the bowed substrate, detecting, with the warpage detection system, remaining non-contact regions of the plurality of chucking regions; and applying additional force, heating, or cooling to the bowed substrate at the remaining non-contact regions.

14. A non-transitory computer readable medium having instructions stored thereon that, when executed via one or more processors, causes the method of chucking the bowed substrate of claim 7 to be performed.

15. A method of chucking a bowed substrate, comprising:

placing the bowed substrate on a substrate support having a plurality of chucking regions, wherein the plurality of chucking regions are pie shaped;

detecting, with a warpage detection system having one or more sensors, one or more contact regions of the plurality of chucking regions where the bowed substrate is touching the substrate support and one or more non-contact regions of the plurality of chucking regions where the bowed substrate is not touching the substrate support; and applying a different amount of force, heating, or cooling to the bowed substrate via the substrate support at locations corresponding to the one or more non-contact regions than force, heating, or cooling applied to the one or more contact regions to flatten the bowed substrate, and wherein applying the force, heating, or cooling comprises at least one of:

vacuum chucking the bowed substrate;

electrostatically chucking the bowed substrate via a plurality of electrodes disposed in the substrate support;

heating or cooling the bowed substrate via a heater or cooling channels disposed in the substrate support;

magnetically attracting the bowed substrate via magnets disposed in the substrate support; or applying a physical force on the bowed substrate via a plurality of pushers.

16. The method of claim 15, wherein applying cooling comprises cooling the bowed substrate with liquid nitrogen.

17. The method of claim 15, wherein the bowed substrate comprises a silicon substrate having copper interconnects.

18. The method of claim 15, wherein applying the force, heating, or cooling comprises:

electrostatically chucking the bowed substrate, and wherein the substrate support includes electrical isolators disposed between adjacent ones of the plurality of chucking regions, or heating or cooling the bowed substrate, and wherein the substrate support includes thermal insulators disposed between adjacent ones of the plurality of chucking regions.

19. The method of claim 15, wherein the physical force is applied to an upper surface of the bowed substrate.

20. The method of claim 15, wherein the substrate support does not apply force to the bowed substrate at the contact regions.

* * * * *